(12) United States Patent
Yamamoto et al.

(10) Patent No.: US 7,173,476 B2
(45) Date of Patent: Feb. 6, 2007

(54) SEMICONDUCTOR INTEGRATED CIRCUIT DEVICE

(75) Inventors: Seiichi Yamamoto, Kyoto (JP); Norihiro Maeda, Kyoto (JP); Toyokazu Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 15 days.

(21) Appl. No.: 10/784,302

(22) Filed: Feb. 24, 2004

(65) Prior Publication Data

US 2004/0164786 A1 Aug. 26, 2004

(30) Foreign Application Priority Data

Feb. 26, 2003 (JP) .............................. 2003-048369

(51) Int. Cl.
*H03K 17/687* (2006.01)
(52) U.S. Cl. .................. 327/427; 327/434; 327/435; 327/437
(58) Field of Classification Search ................ 327/112, 327/322, 577; 323/285, 284
See application file for complete search history.

(56) References Cited

U.S. PATENT DOCUMENTS

| | | | | |
|---|---|---|---|---|
| 4,798,983 A | * | 1/1989 | Mori | 327/433 |
| 5,081,379 A | | 1/1992 | Korteling | 327/50 |
| 5,136,293 A | * | 8/1992 | Matsuo et al. | 341/144 |
| 5,412,349 A | * | 5/1995 | Young et al. | 331/34 |
| 5,585,763 A | * | 12/1996 | Navabi et al. | 330/255 |
| 5,596,265 A | * | 1/1997 | Wrathall et al. | 323/315 |
| 5,821,823 A | * | 10/1998 | Bereza | 331/57 |
| 6,177,826 B1 | * | 1/2001 | Mashiko et al. | 327/534 |
| 6,236,270 B1 | * | 5/2001 | Takeuchi | 330/253 |
| 6,323,703 B1 | * | 11/2001 | Fotouhi | 327/112 |
| 6,559,685 B2 | * | 5/2003 | Green | 327/57 |
| 6,624,671 B2 | * | 9/2003 | Fotouhi | 327/112 |
| 6,636,098 B1 | * | 10/2003 | Kizer | 327/345 |
| 6,921,199 B2 | * | 7/2005 | Aota et al. | 374/178 |
| 2005/0127998 A1 | * | 6/2005 | Maekawa et al. | 330/253 |

FOREIGN PATENT DOCUMENTS

| | | |
|---|---|---|
| JP | 63-229757 | 9/1988 |
| JP | 02-226407 | 9/1990 |
| JP | 06-061432 | 3/1994 |
| JP | 2002-016219 | 1/2002 |
| JP | 2002-026707 | 1/2002 |
| JP | 2002-280886 | 9/2002 |

* cited by examiner

*Primary Examiner*—Tuan T. Lam
*Assistant Examiner*—Hiep Nguyen
(74) *Attorney, Agent, or Firm*—Arent Fox PLLC (57) ABSTRACT

The drain of a power transistor M1 is connected to the non-inverting input terminal of an operational amplifier A and the drain of a transistor M2 is connected to the inverting input terminal of the operational amplifier A to make substantially equal the drain voltages of the power transistor M1 and the transistor M2, of which the gates are connected together and of which the sources are connected together. The drain current of the transistor M2 is outputted via a detection terminal 13 as a current signal proportional to the drain current of the power transistor M1.

5 Claims, 7 Drawing Sheets

SEMICONDUCTOR INTEGRATED CIRCUIT DEVICE

This application is based on Japanese Patent Application No. 2003-048369 filed on Feb. 26, 2003, the contents of which are hereby incorporated by reference.

BACKGROUND OF THE INVENTION

1. Field of the Invention

The present invention relates to a semiconductor integrated circuit device provided with a power transistor, such as a power MOSFET or power bipolar transistor, through which a large current is passed.

2. Description of the Prior Art

In a semiconductor integrated circuit device, such as a motor driver, that is provided with a power transistor through which a large current is passed to drive a load, there is usually provided, for the purpose of preventing the power transistor from being destroyed as a result of a current larger than the rated current flowing therethrough, a current detection circuit for detecting the current that flows through the power transistor or an overcurrent protection circuit. One type of such a current detection circuit or overcurrent protection circuit achieves current detection by the use of a resistor for current detection which is connected directly in the circuit that includes the power transistor.

In some applications, a semiconductor integrated circuit device provided with a power transistor is operated from a supply voltage as low as, for example, 5 V. In such a case, to secure a sufficiently wide dynamic range in the voltage fed to the load, it is necessary to minimize the voltage drop in the voltage fed to the load. Thus, considering the voltage drop across the resistor for current detection which is connected in series with the circuit including the power transistor, the circuit configuration described above is not fit for a semiconductor integrated circuit device that is operated from a low supply voltage.

As examples of prior-art techniques that employ a current detection circuit or overcurrent protection circuit in which the aforementioned voltage drop is reduced, Japanese Patent Applications Published Nos. H7-120221 and H8-34222 and Japanese Patent Applications Laid-Open Nos. 2002-16219, 2002-26707, and 2002-280886 propose power MOSFETs furnished with an overcurrent protection function wherein the power transistor is protected from overcurrent according to the current from a transistor whose drain and gate are kept at the same potentials as the drain and gate, respectively, of the power transistor. As another example of a prior-art technique, Japanese Patent Application Laid-Open No. H6-61432 proposes a semiconductor device wherein a power FET and a sense FET connected in parallel with the power FET are connected individually to the input terminals of an operational amplifier so that current detection is achieved by monitoring the potential difference between the output terminal of the operational amplifier and the input terminal of the sense FET.

In an overcurrent protection circuit or current detection circuit configured as proposed in Japanese Patent Applications Published Nos. H7-120221 and H8-34222 and Japanese Patent Applications Laid-Open Nos. 2002-16219, 2002-26707, and 2002-280886, the current through the power transistor is detected by detecting the current from the transistor whose drain and gate are kept at the same potentials as the drain and gate, respectively, of the power transistor. However, in this configuration, the sources of the two transistors are not forcibly kept at the same potential. Accordingly, the transistor for current detection and the power transistor do not operate in the perfectly identical state. Thus, it is not always possible to detect a current proportional to the current that flows through the power transistor.

On the other hand, in the semiconductor device proposed in Japanese Patent Application Laid-Open No. H6-61432, a resistor is connected between the inverting input terminal and output terminal of the operational amplifier, and therefore, even when the source current of the sense FET is outputted as a detection current from the inverting input terminal side of the operational amplifier, part of the source current of the sense FET flows through the resistor into the operational amplifier. Thus, the source current of the sense FET is not completely outputted, but varies according to the state in which it is operating. This necessitates adopting a configuration in which the current though the power FET is detected by detecting the difference between the voltage on the output terminal side of the operational amplifier and the voltage on the inverting input terminal side of the operational amplifier.

Furthermore, in this configuration, to pass the source current of the sense FET through the resistor connected between the output terminal and inverting input terminal of the operational amplifier, the inverting input terminal of the operational amplifier needs to be connected to a circuit stage into which no current flows from an input terminal of a comparator, operational amplifier, or the like. That is, it is necessary to provide a circuit functioning as a voltage amplification stage in the succeeding stage. Moreover, to output a current signal, this voltage amplification stage needs to be built as a voltage-to-current conversion stage.

SUMMARY OF THE INVENTION

An object of the present invention is to provide a semiconductor integrated circuit device that permits a transistor used for current detection to operate in the identical state with a power transistor and that outputs a current signal as a detection signal.

To achieve the above object, according to one aspect of the present invention, a semiconductor integrated circuit device is provided with a power transistor that feeds a large current to a load; a first transistor of which the second electrode and the control electrode are connected to the second electrode and the control electrode of the power transistor; a second transistor of which one of the first electrode and the second electrode is connected to the first electrode of the first transistor; and an operational amplifier of which one input terminal is connected to the first electrode of the power transistor, of which the other input terminal is connected to the first electrode of the first transistor, and of which the output terminal is connected to the control electrode of the second transistor. Here, the second transistor outputs, at the other of the first and second electrodes thereof, a current signal proportional to the current flowing through the power transistor.

According to another aspect of the present invention, a semiconductor integrated circuit device is provided with: a power transistor that feeds a large current to a load; a first transistor of which the second electrode and the control electrode are connected to the second electrode and the control electrode of the power transistor; a second transistor of which the second electrode is connected to the first electrode of the first transistor; and a third transistor of which the control electrode is connected to the first electrode of the power transistor and of which the second electrode is connected to the control electrode of the second transistor. Here, the second transistor outputs, at the first electrode thereof, a current signal proportional to the current flowing through the power transistor.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

First Embodiment

Figure 1:
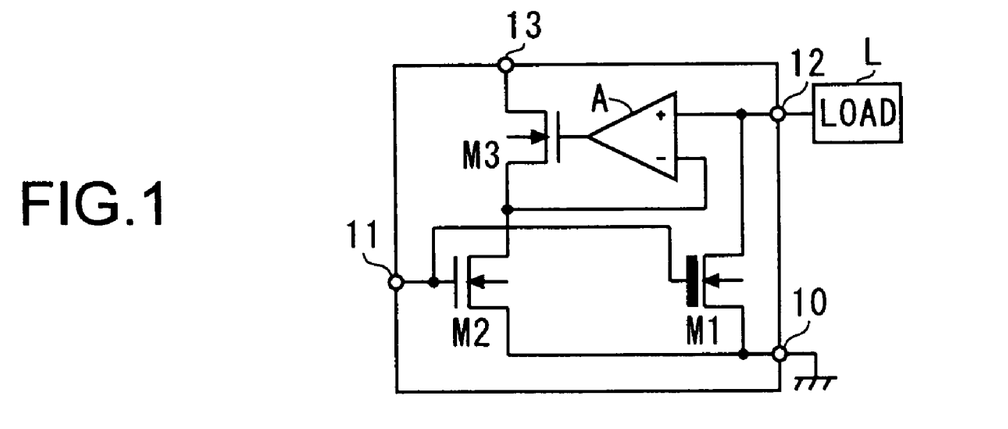
FIG. 1 is a circuit block diagram showing an example of the internal configuration of the semiconductor integrated circuit device of a first embodiment of the invention.

A first embodiment of the present invention will be described below with reference to the drawings. FIG. 1 is a circuit block diagram showing an example of the internal configuration of the semiconductor integrated circuit device provided with a power transistor according to this embodiment.

The semiconductor integrated circuit device shown in FIG. 1 is composed of: a power transistor M1 that feeds a current to a load L; a transistor M2 of which the gate and source are connected to the gate and source, respectively, of the power transistor M1; an operational amplifier A of which the non-inverting input terminal is connected to the drain of the power transistor M1 and of which the inverting input terminal is connected to the drain of the transistor M2; and a transistor M3 of which the gate is connected to the output terminal of the operational amplifier A and of which the source is connected to the drain of the transistor M2.

The sources of the power transistor M1 and the transistor M2 are grounded via a ground terminal 10, and a control signal is fed via a control terminal 11 to the gates of the power transistor M1 and the transistor M2. The drain of the power transistor M1 is connected via a load terminal 12 to a load L. The drain of the transistor M3 is connected to a detection terminal 13 via which a detection current is fed out. Here, the power transistor M1 and the transistors M2 and M3 are all N-channel MOSFETs. The transistor M3 and the operational amplifier A constitute a negative feedback circuit.

In the semiconductor integrated circuit device configured as described above, the voltages at the inverting and non-inverting input terminals of the operational amplifier A are approximately equal, and thus the voltages at the drains of the power transistor M1 and the transistor M2 are approximately equal. As a result, since the power transistor M1 and the transistor M2 have their sources connected together and have their gates connected together, the voltages at their drains are equal, the voltages at their sources are equal, and the voltage at their gates are equal.

By making the voltages applied to the different electrodes of the power transistor M1 equal to the voltages applied to the corresponding electrodes of the transistor M2 in this way, the drain current through the transistor M2 can be made proportional to the drain current through the power transistor M1. Specifically, let the gate width and gate length of the power transistor M1 be W1 and L1, respectively, and let the gate width and gate length of the transistor M2 be W2 and L2, respectively. Then, with respect to the drain current I1 through the power transistor M1, the drain current I2 through the M2 is given as I1×(W2/L2)/(W1/L1). Here, whereas the drain current through the transistor M2 is of the order of several μA to several ten μA, the drain current through the power transistor M1 is of the order of several hundred μA.

Moreover, the provision of the transistor M3 permits the output voltage of the operational amplifier A to be used for the sole purpose of being sampled as the gate voltage of the transistor M3. This helps to prevent a current from flowing out of the operational amplifier A as part of the drain current of the transistor M3, or part of the current flowing through the detection terminal 13 from flowing into the operational amplifier A, as opposed to in a case where the transistor M2 is connected through a resistor or the like directly to the output terminal of the operational amplifier A. As a result, the current appearing at the detection terminal 13 is not influenced by a current flowing into or out of the operational amplifier A, and thus the current appearing at the detection terminal 13 represents the drain current of the transistor M2, which is proportional to the drain current of the power transistor M1.

Figure 2:
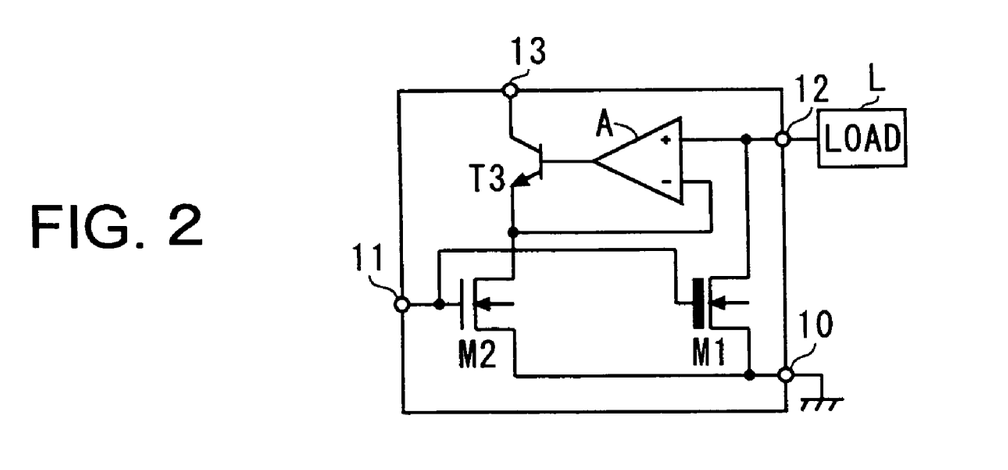
FIG. 2 is a circuit block diagram showing another example of the internal configuration of the semiconductor integrated circuit device of the first embodiment of the invention.

In FIG. 1, an N-channel MOSFET is used as the transistor M3. It is, however, also possible to use, as shown in FIG. 2, an npn-type bipolar transistor as a transistor T3 in place of the transistor M3. In this case, the transistor T3 has its collector connected to the detection terminal 13, has its base connected to the output terminal of the operational amplifier A, and has its emitter connected to the drain of the transistor M2. That is, the transistor T3 and the operational amplifier A constitute a negative feedback circuit. Since the base current of this transistor T3 is negligible as compared with its collector current, just as in the case shown in FIG. 1, the current appearing at the detection terminal 13 represents the drain current of the transistor M2, which is proportional to the drain current of the power transistor M1.

Figure 3A:
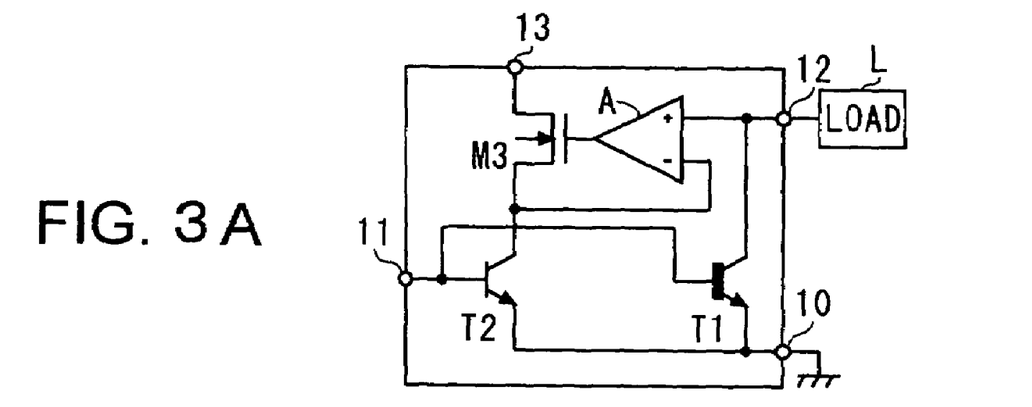
FIGS. 3A and 3B are circuit block diagrams showing other examples of the internal configuration of the semiconductor integrated circuit device of the first embodiment of the invention.
Figure 3B:
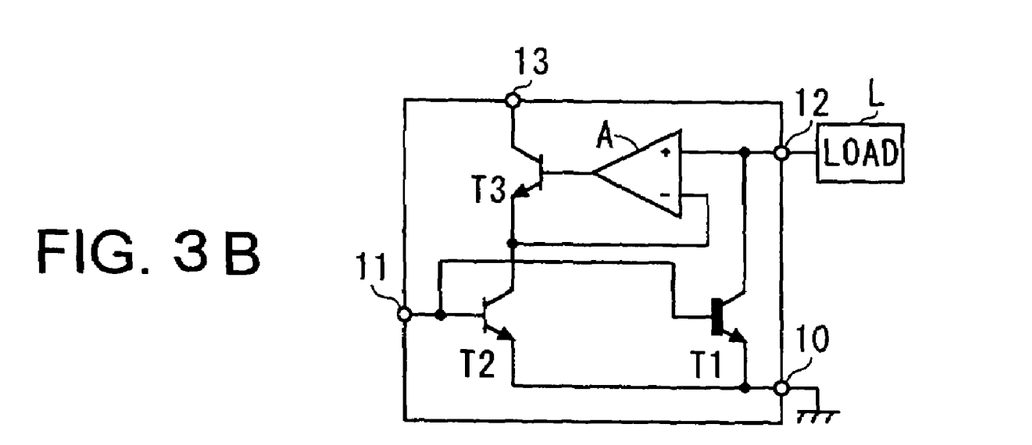

In FIGS. 1 and 2, an N-channel MOSFET is used as the power transistor M1. It is, however, also possible to use, as shown in FIGS. 3A and 3B, an npn-type bipolar transistor as a power transistor T1 in place of the power transistor M1. In this case, in place of the transistor M2, which is an N-channel MOSFET, an npn-type bipolar transistor is used as a transistor T2.

The non-inverting and inverting input terminals of the operational amplifier A are connected to the collectors of the power transistor T1 and the transistor T2, respectively. The emitters of the power transistor T1 and the transistor T2 are connected to the ground terminal 10, and the bases of the power transistor T1 and the transistor T2 are connected to the control terminal 11. FIG. 3A shows a case where an N-channel MOSFET is used as the transistor M3, and FIG. 3B shows a case where an npn-type bipolar transistor is used as the transistor T3.

In the configurations shown in FIGS. 3A and 3B, the operational amplifier A and the transistor M3 or T3 have the same functions as the operational amplifier A and the transistor M3 or T3 in FIGS. 1 and 2. Moreover, the voltages at the emitters of the power transistor T1 and the transistor T2 are equal, the voltages at their collectors are equal, and the voltages at their bases are equal. Thus, through the power transistor T1 and the transistor T2 flow collector currents that are proportional to their emitter areas. As a result, let the emitter areas of the power transistor T1 and the transistor T2 be S1 and S2, respectively, then, with respect to the collector current I1 of the power transistor T1, the collector current I2 through the transistor T2 is I1×S2/S1, and this collector current I2 appears at the detection terminal 13.

Figure 4A:
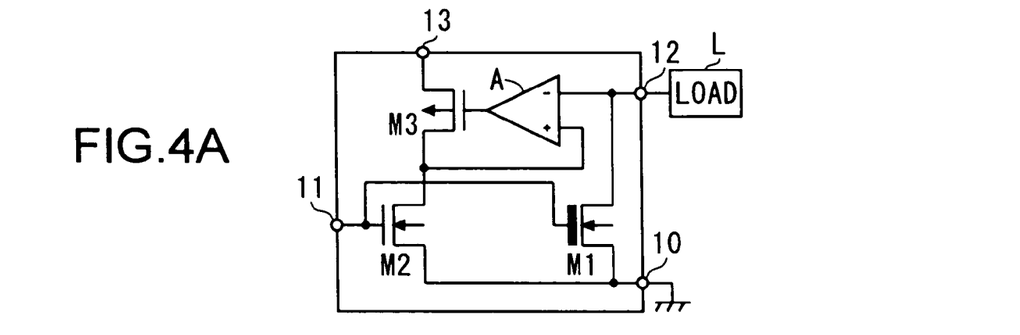
FIGS. 4A to 4D are circuit block diagrams showing other examples of the internal configuration of the semiconductor integrated circuit device of the first embodiment of the invention.
Figure 4B:
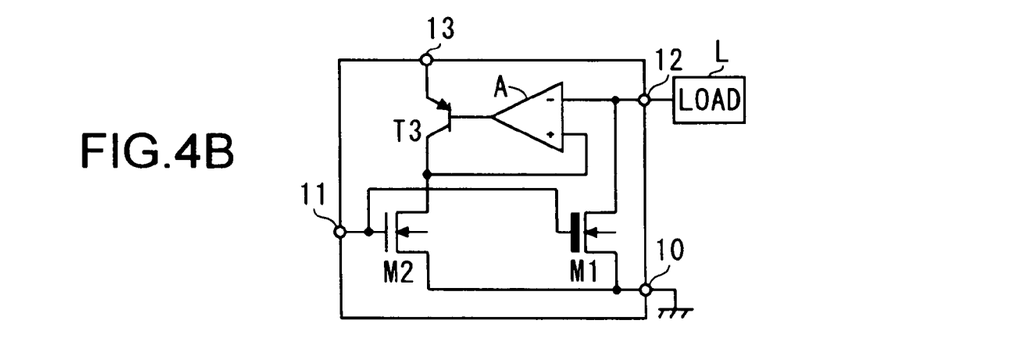
Figure 4C:
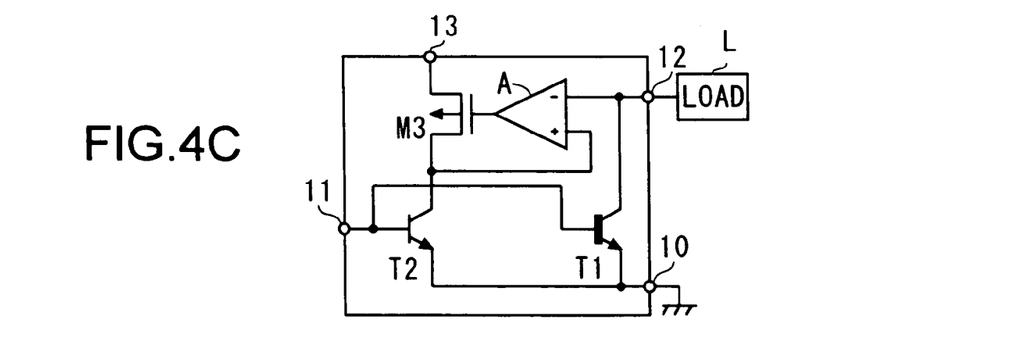
Figure 4D:
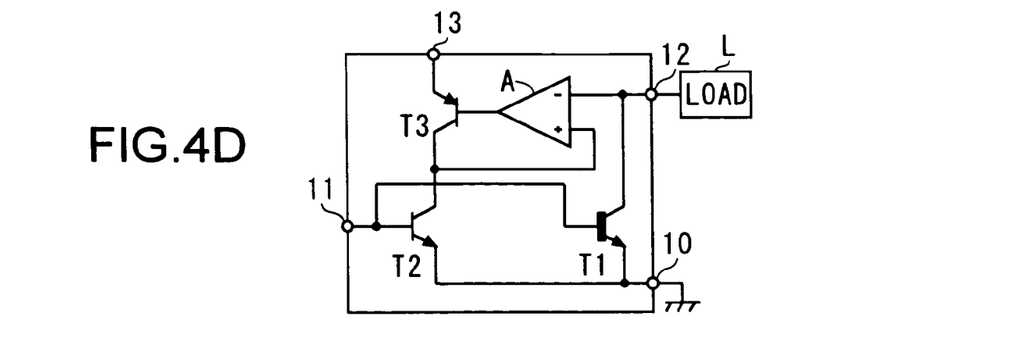

In FIGS. 1, 2, 3A, and 3B, the power transistor M1 or T1 is connected to the non-inverting input terminal of the operational amplifier A and the transistor M2 or T2 is connected to the inverting input terminal of the operational amplifier A. It is, however, also possible to reverse the connection to the non-inverting and inverting input terminals of the operational amplifier A. Specifically, in that case, as shown in FIGS. 4A and 4B, the drains of the power transistor M1 and the transistor M2 are connected to the inverting and non-inverting input terminals, respectively, of the operational amplifier A, or, as shown in FIGS. 4C and 4D, the collectors of the power transistor T1 and the transistor T2 are connected to the inverting and non-inverting input terminals, respectively, of the operational amplifier A.

In this case, the transistor M3 or T3 connected to the output terminal of the operational amplifier A is a P-channel MOSFET or pnp-type bipolar transistor, respectively, so that the operational amplifier A and the transistor M3 or T3 constitute a negative feedback circuit. Specifically, as shown in FIGS. 4A and 4C, the transistor M3 has its gate connected to the output terminal of the operational amplifier A, has its source connected to the detection terminal 13, and has its drain connected to the non-inverting input terminal of the operational amplifier A; or, as shown in FIGS. 4B and 4D, the transistor T3 has its base connected to the output terminal of the operational amplifier A, has its emitter connected to the detection terminal 13, and has its collector connected to the non-inverting input terminal of the operational amplifier A.

In FIGS. 1, 2, 3A, 3B, and 4A to 4D, the power transistor M1 and the transistor M2 are N-channel MOSFETs, or the power transistor T1 and the transistor T2 are npn-type bipolar transistors. It is, however, also possible to use, as shown in FIGS. 5A to 5D, P-channel MOSFETs as the power transistor M1 and the transistor M2, or pnp-type bipolar transistors as the power transistor T1 and the transistor T2.

Figure 5A:
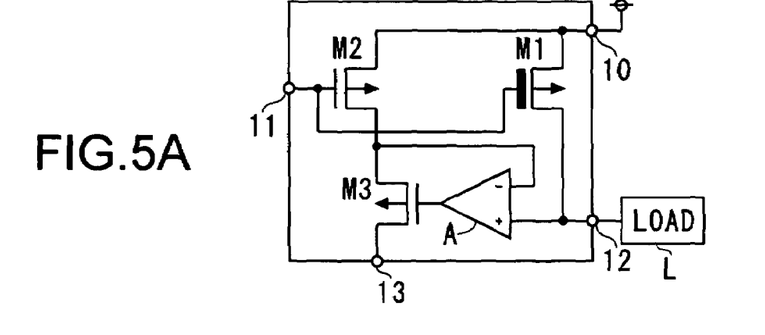
FIGS. 5A to 5D are circuit block diagrams showing other examples of the internal configuration of the semiconductor integrated circuit device of the first embodiment of the invention.
Figure 5B:
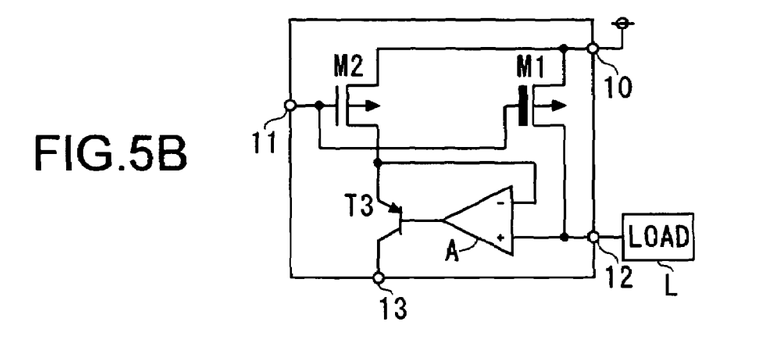

In this case, as shown in FIGS. 5A and 5B, the drains of the power transistor M1 and the transistor M2 are connected to the non-inverting and inverting input terminals, respectively, of the operational amplifier A. Moreover, a P-channel MOSFET or pnp-type bipolar transistor is used as the transistor M3 or T3, respectively, and the non-inverting input terminal of the operational amplifier A is connected to the output terminal 12. Thus, the circuit configurations shown in FIGS. 5A and 5B have, though with the opposite polarity, the same interconnection as those shown in FIGS. 1 and 2.

Figure 5C:
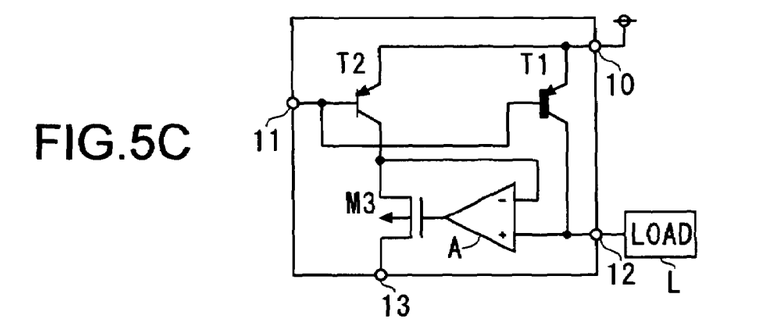
Figure 5D:
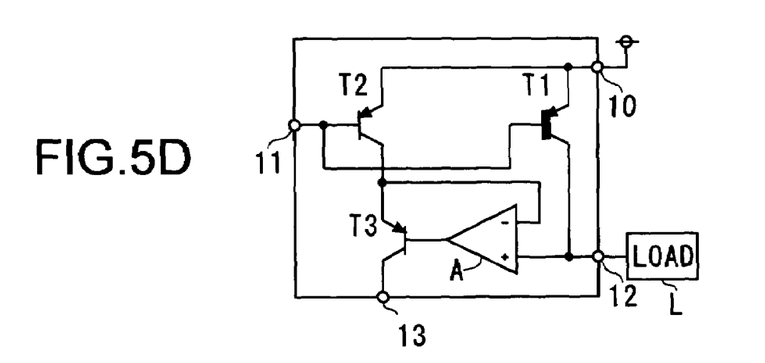

Alternatively, as shown in FIGS. 5C and 5D, the collectors of the power transistor T1 and the transistor T2 are connected to the non-inverting and inverting input terminals, respectively, of the operational amplifier A. Moreover, a P-channel MOSFET or pnp-type bipolar transistor is used as the transistor M3 or T3, respectively, and the non-inverting input terminal of the operational amplifier A is connected to the output terminal 12. Thus, the circuit configurations shown in FIGS. 5C and 5D have, though with the opposite polarity, the same interconnection as those shown in FIGS. 3A and 3B.

Figure 6A:
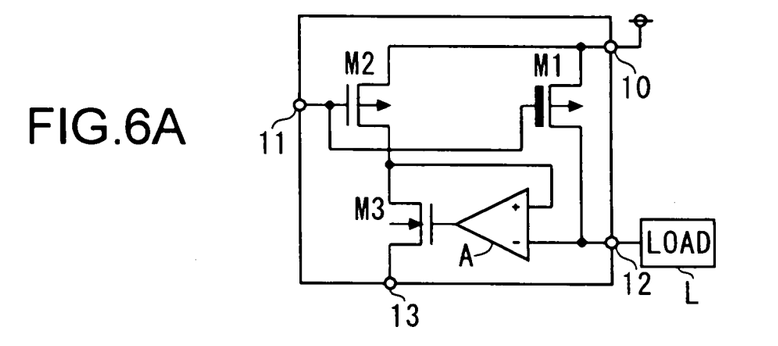
FIGS. 6A to 6D are circuit block diagrams showing other examples of the internal configuration of the semiconductor integrated circuit device of the first embodiment of the invention.
Figure 6B:
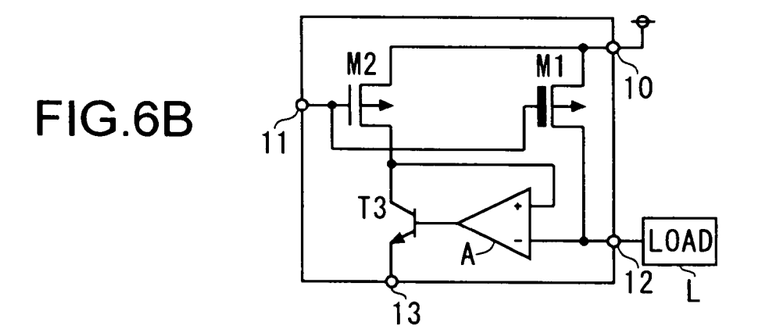

Alternatively, as shown in FIGS. 6A and 6B, the drains of the power transistor M1 and the transistor M2 are connected to the inverting and non-inverting input terminals, respectively, of the operational amplifier A. Moreover, an N-channel MOSFET or npn-type bipolar transistor is used as the transistor M3 or T3, respectively, and the inverting input terminal of the operational amplifier A is connected to the output terminal 12. Thus, the circuit configurations shown in FIGS. 6A and 6B have, though with the opposite polarity, the same interconnection as those shown in FIGS. 4A and 4B.

Figure 6C:
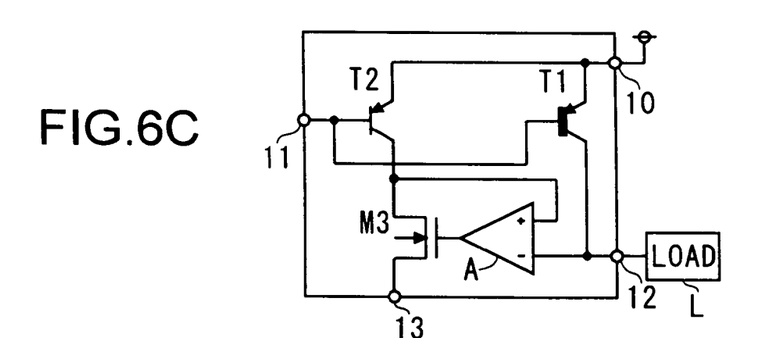
Figure 6D:
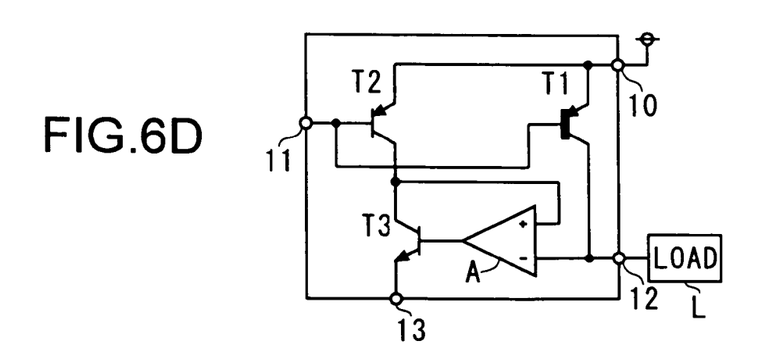

Alternatively, as shown in FIGS. 6C and 6D, the collectors of the power transistor T1 and the transistor T2 are connected to the inverting and non-inverting input terminals, respectively, of the operational amplifier A. Moreover, an N-channel MOSFET or npn-type bipolar transistor is used as the transistor M3 or T3, respectively, and the inverting input terminal of the operational amplifier A is connected to the output terminal 12. Thus, the circuit configurations shown in FIGS. 6C and 6D have, though with the opposite polarity, the same interconnection as those shown in FIGS. 4C and 4D.

Second Embodiment

Figure 7:
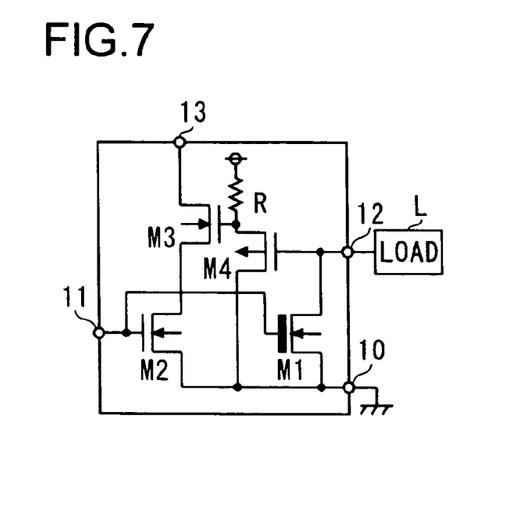
FIG. 7 is a circuit block diagram showing an example of the internal configuration of the semiconductor integrated circuit device of a second embodiment of the invention.

A second embodiment of the present invention will be described below with reference to the drawings. FIG. 7 is a circuit block diagram showing an example of the internal configuration of the semiconductor integrated circuit device provided with a power transistor according to this embodiment. In FIG. 7, such circuit elements as are found also in FIG. 1 are identified with the same reference numerals, and their detailed explanations will not be repeated.

The semiconductor integrated circuit device shown in FIG. 7 differs from that shown in FIG. 1 in that the operational amplifier A shown in FIG. 1 is omitted, and that there are instead provided a resistor R and a transistor M4. A supply voltage VDD is fed to one end of the resistor R. The transistor M4 has its source connected to the other end of the resistor R and to the gate of the transistor M3, and has its gate connected to the drain of the power transistor M1. This transistor M4 is a P-channel MOSFET, and has its drain grounded via the ground terminal 10. The transistors M3 and M4 have substantially equal source-gate threshold voltages Vth.

In this configuration, if the drain voltage of the power transistor M1 is assumed to be Va, the drain voltage Va of this power transistor M1 is fed to the gate of the transistor M4, and thus the source voltage of the transistor M4 equals Va+Vth. The source voltage Va+Vth of this transistor M4 is fed to the gate of the transistor M3, and thus the source voltage of the transistor M3 equals Va+Vth−Vth=Va. This makes the drain voltage of the transistor M2 equal to Va, i.e., equal to the drain voltage of the power transistor M1.

Accordingly, the drain voltage, gate voltage, and source voltage of the transistor M2 equal the drain voltage, gate voltage, and source voltage, respectively, of the power transistor M1. Thus, the drain current of the transistor M2 is proportional, by a factor of (Gate Width)/(Gate Length), to the drain current of the power transistor M1. Moreover, the drain voltage of the power transistor M1 is used for the sole purpose of being sampled as the gate voltage of the transistor M4, and the source voltage of the transistor M4 is used for the sole purpose of being sampled as the gate voltage of the transistor M3. This helps to reduce the influence on the drain current of the transistor M2 which is fed out via the detection terminal 13.

Specifically, the drain current of the transistor M3 is not increased or decreased by the current that flows through the circuit constituted by the transistor M4 and the resistor R, but is equal to the drain current of the transistor M2. Moreover, the current that flows through the power transistor M1 is not increased or decreased by the current that flows through the circuit constituted by the transistor M4 and the resistor R, but is equal to the current that flows through the load L. Thus, as in the first embodiment, the current that appears at the detection terminal 13 is equal to the drain current of the transistor M2, which is proportional to the drain current of the power transistor M1.

Figure 8:
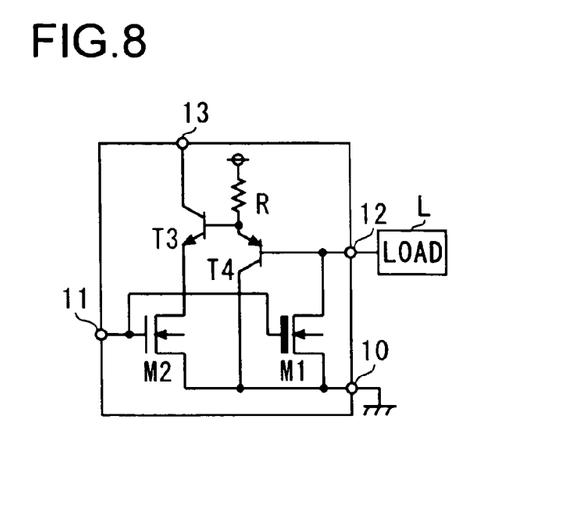
FIG. 8 is a circuit block diagram showing another example of the internal configuration of the semiconductor integrated circuit device of the second embodiment of the invention.

In FIG. 7, an N-channel MOSFET is used as the transistor M3 and a P-channel MOSFET is used as the transistor M4. It is, however, also possible to use, as shown in FIG. 8, an npn-type bipolar transistor as a transistor T3 in place of the transistor M3 and an pnp-type bipolar transistor T4 in place of the transistor M4.

Figure 9A:
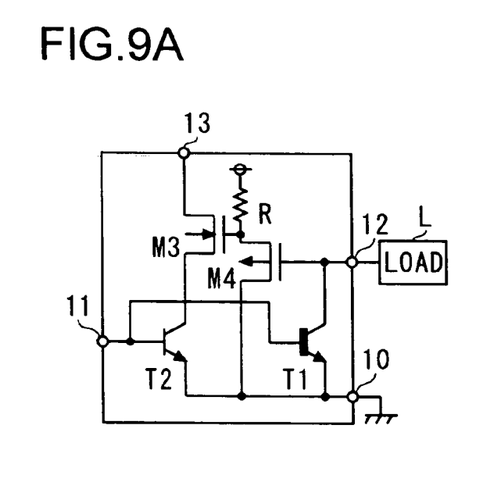
FIGS. 9A and 9B are circuit block diagrams showing other examples of the internal configuration of the semiconductor integrated circuit device of the second embodiment of the invention.
Figure 9B:
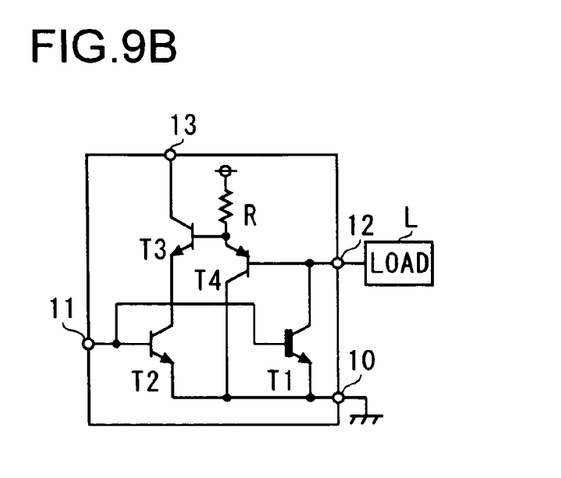

In this case, the transistor T3 has its collector connected to the detection terminal 13, has its base connected to the other end of the resistor R, and has its emitter connected to the drain of the transistor M2. Moreover, the transistor T4 has its collector connected to the ground terminal 10, has its base connected to the drain of the power transistor M1, and has its emitter connected to the base of the transistor T3. The base currents of these transistors T3 and T4 are negligible as compared with their collector currents, and therefore, as in the case shown in FIG. 7, the current appearing at the detection terminal 13 represents the drain current of the transistor M2, which is proportional to the drain current of the power transistor In FIGS. 7 and 8, an N-channel MOSFET is used as the power transistor M1. It is, however, also possible to use, as shown in FIGS. 9A and 9B, an npn-type bipolar transistor as a power transistor T1 in place of the power transistor M1. In this case, in place of the transistor M2, which is an N-channel MOSFET, an npn-type bipolar transistor is used as a transistor T2.

In FIG. 9A, the collector of the power transistor T1 is connected to the gate of the transistor M4, and the collector of the transistor T2 is connected to the source of the transistor M3. In FIG. 9B, the collector of the power transistor T1 is connected to the base of the transistor T4, and the collector of the transistor T2 is connected to the emitter of the transistor T3. Moreover, in FIGS. 9A and 9B, the emitters of the power transistor T1 and the transistor T2 are connected to the ground terminal 10, and the bases of the power transistor T1 and the transistor T2 are connected to the control terminal 11.

In FIGS. 7, 8, 9A, and 9B, N-channel MOSFETs are used as the power transistor M1 and the transistor M2, or npn-type bipolar transistors are used as the power transistor T1 and the transistor T2. It is, however, also possible to use P-channel MOSFETs as the power transistor M1 and the transistor M2, or pnp-type bipolar transistors as the power transistor T1 and the transistor T2.

Figure 10A:
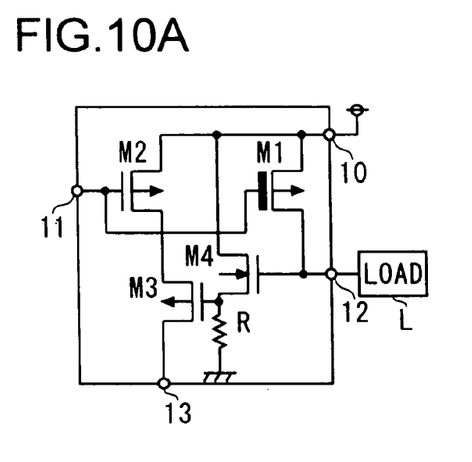
FIGS. 10A to 10D are circuit block diagrams showing other examples of the internal configuration of the semiconductor integrated circuit device of the second embodiment of the invention.
Figure 10B:
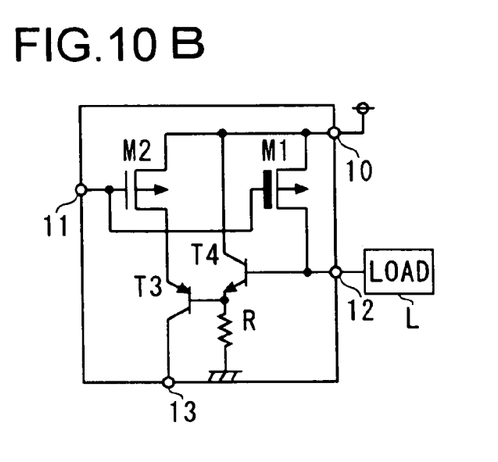
Figure 10C:
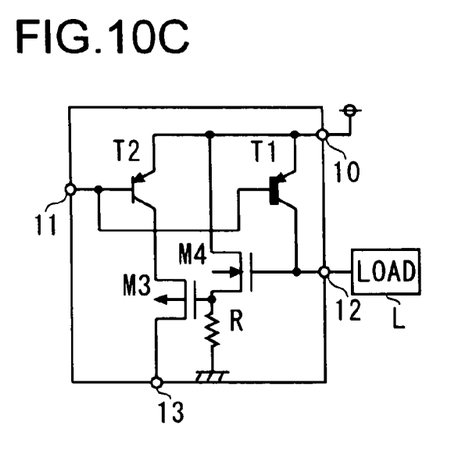

Alternatively, as shown in FIGS. 10A and 10C, a P-channel MOSFET is used as the transistor M3, which has its source connected to the drain of the transistor M2 or to the collector of the transistor T2, and an N-channel MOSFET is used as the transistor M4, which has its gate connected to the drain of the power transistor M1 or to the collector of the power transistor T1. Thus, the circuit configurations shown in FIGS. 10A and 10C have, though with the opposite polarity, the same interconnection as those shown in FIGS. 7 and 9A.

Figure 10D:
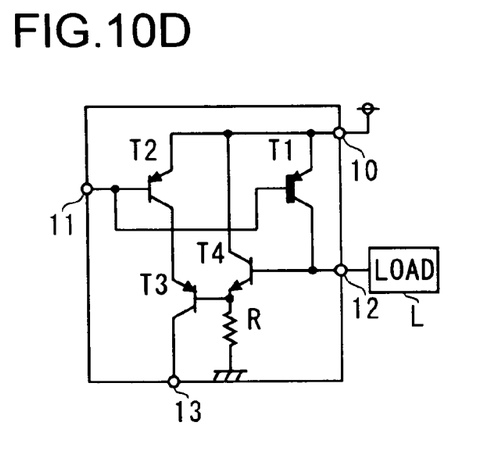

Alternatively, as shown in FIGS. 10B and 10D, a pnp-type bipolar transistor is used as the transistor T3, which has its emitter connected to the drain of the transistor M2 or to the collector of the transistor T2, and an npn-type bipolar transistor is used as the transistor T4, which has its base connected to the drain of the power transistor M1 or to the collector of the power transistor T1. Thus, the circuit configurations shown in FIGS. 10B and 10D have, though with the opposite polarity, the same interconnection as those shown in FIGS. 8 and 9B.

According to the present invention, a current that flows through a first transistor, which receives at its first, second, and control electrodes voltages that are substantially equal to the voltages at the first, second, and control electrodes, respectively, of a power transistor, is outputted as a current signal. This makes the current signal that flows through the first transistor, which operates in substantially the identical state with the power transistor, proportional to the current signal that flows through the power transistor, permitting more accurate monitoring of the current that flows through the power transistor. Moreover, the current signal that flows through the first transistor and that is eventually outputted is not influenced by a current that flows through another circuit portion. This gives the outputted current signal higher reliability.

What is claimed is:

1. A semiconductor integrated circuit device comprising:
a power transistor that feeds a large current to a load;
a first transistor of which a second electrode and a control electrode are connected respectively to a second electrode and a control electrode of the power transistor;
a second transistor of which a second electrode is connected to a first electrode of the first transistor; and
a third transistor of which a control electrode is connected to a first electrode of the power transistor and of which a second electrode is connected to a control electrode of the second transistor, wherein the second transistor outputs, at a first electrode thereof, a current signal proportional to a current flowing through the power transistor.

2. A semiconductor integrated circuit device as claimed in claim 1,
wherein a first electrode of the third transistor is connected to the second electrodes of the power transistor and the first transistor, and a direct-current voltage is applied through a resistor to the second electrode of the third transistor.

3. A semiconductor integrated circuit device as claimed in claim 1,
wherein the second and third transistors are transistors of opposite polarities, and a potential difference appearing between the second electrode and control electrode of the second transistor is substantially equal to a potential difference appearing between the second electrode and control electrode of the third transistor.

4. A semiconductor integrated circuit device as claimed in claim 3, wherein the second transistor is a transistor of a same polarity as the first transistor.

5. A semiconductor integrated circuit device as claimed in claim 4,
wherein a first electrode of the third transistor is connected to the second electrodes of the power transistor and the first transistor, and a direct-current voltage is applied through a resistor to the second electrode of the third transistor.

* * * * *